United States Patent
Wu

(10) Patent No.: US 8,154,705 B2
(45) Date of Patent: Apr. 10, 2012

(54) METHOD OF DEFINING PATTERNS IN SMALL PITCH AND CORRESPONDING EXPOSURE SYSTEM

(75) Inventor: Tzong-Hsien Wu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 788 days.

(21) Appl. No.: 11/773,889

(22) Filed: Jul. 5, 2007

(65) Prior Publication Data
US 2009/0009743 A1 Jan. 8, 2009

(51) Int. Cl.
G03B 27/70 (2006.01)
G03B 27/54 (2006.01)
G03B 27/32 (2006.01)
G03B 27/52 (2006.01)
G03B 27/42 (2006.01)

(52) U.S. Cl. .......... 355/60; 355/53; 355/55; 355/67; 355/77

(58) Field of Classification Search .......... 355/53, 355/67–71, 77, 55, 60, 66; 430/312, 313, 430/394, 322, 325, 327, 5, 22, 311; 250/548, 250/492.1, 492.2, 492.22; 359/1, 8, 10, 11, 359/12, 28, 30, 35
See application file for complete search history.

(56) References Cited

U.S. PATENT DOCUMENTS

| | | | |
|---|---|---|---|
| 5,142,385 A * | 8/1992 | Anderson et al. | 359/10 |
| 5,279,706 A * | 1/1994 | Balch et al. | 216/15 |
| 5,759,744 A * | 6/1998 | Brueck et al. | 430/312 |
| 7,005,235 B2 * | 2/2006 | Lin | 430/311 |
| 7,105,099 B2 | 9/2006 | Chung et al. | |
| 7,189,635 B2 | 3/2007 | Sharma | |
| 7,228,034 B2 * | 6/2007 | Allen | 385/37 |
| 7,440,078 B2 * | 10/2008 | Bleeker et al. | 355/53 |
| 7,561,252 B2 * | 7/2009 | Sewell et al. | 355/67 |
| 2001/0035991 A1 * | 11/2001 | Hobbs et al. | 359/35 |
| 2002/0149751 A1 * | 10/2002 | Bloomstein et al. | 353/122 |
| 2003/0011755 A1 * | 1/2003 | Omura et al. | 355/67 |
| 2005/0019675 A1 * | 1/2005 | Hendriks et al. | 430/5 |
| 2005/0064297 A1 * | 3/2005 | Wago | 430/5 |
| 2005/0122497 A1 * | 6/2005 | Lyons et al. | 355/53 |
| 2006/0273456 A1 | 12/2006 | Sant et al. | |

FOREIGN PATENT DOCUMENTS

| | | | |
|---|---|---|---|
| JP | 60208834 A | * | 10/1985 |
| TW | 503446 | | 9/2002 |

* cited by examiner

*Primary Examiner* — Peter B Kim
*Assistant Examiner* — Christina Riddle
(74) *Attorney, Agent, or Firm* — J.C. Patents

(57) ABSTRACT

A method of defining patterns in a small pitch is described. A substrate having a target layer thereon is provided, and two laterally separate reflective structures with two opposite sidewalls are formed over the target layer. A photoresist layer is formed over the target layer between the two opposite sidewalls. An exposure step is performed allowing light to be reflected by the two opposite sidewalls in the lateral direction, wherein the two opposite sidewalls are spaced by a distance to cause the reflected light to produce a periodical intensity distribution in the photoresist layer in the lateral direction.

14 Claims, 2 Drawing Sheets

METHOD OF DEFINING PATTERNS IN SMALL PITCH AND CORRESPONDING EXPOSURE SYSTEM

BACKGROUND OF THE INVENTION

1. Field of the Invention

This invention relates to the lithography technology, and more particularly to a method of defining patterns in a small pitch and a corresponding exposure system that can define patterns in a small pitch.

2. Description of the Related Art

To increase the degree of integration of semiconductor devices, the resolution in lithography processes has to be further enhanced. FIG. 1 shows a typical arrangement between a photomask 100, a lens set 110 and transferred patterns 120 in a lithography process in the prior art, wherein the lens set 110 is represented by only one lens.

The resolution R of the lithography process is defined as "R=k·λ/NA", wherein k is a constant mainly related to the photomask 100, λ is the wavelength of the exposure light and NA is the numerical aperture of the exposure system. The numerical aperture is defined as "NA=n·sin(θ/2)", wherein n is the refraction index of the medium in which the lens set 110 is working and θ is the angle of the maximal cone of light that can enter or exit the lens set 110.

Accordingly, to obtain the largest NA or the highest resolution at given k, λ and n values, θ has to be equal to 180°. However, this is impossible for any lens set alone.

SUMMARY OF THE INVENTION

Accordingly, this invention provides a method of defining patterns in a small pitch, by which the highest resolution at a given λ value can be achieved.

This invention also provides an exposure system capable of defining patterns in a small pitch, which corresponds to the method of this invention.

The method of defining patterns in a small pitch of this invention is described below. A substrate having a target layer thereon is provided, and two laterally separate reflective structures having two opposite sidewalls are formed over the target layer. A photoresist layer is formed over the target layer between the two reflective structures. An exposure step is performed allowing light to be reflected by the two opposite sidewalls in a lateral direction, wherein the two opposite sidewalls are spaced by a distance to cause the reflected light to produce a periodical intensity distribution in the photoresist layer in the lateral direction.

The exposure system that can define patterns in a small pitch of this invention includes a light source, a lens set, a photomask between the light source and the lens set, and two laterally separate reflective structures with opposite sidewalls that are disposed over a target layer on a substrate, which has thereon a photoresist layer between the two opposite sidewalls. The photomask allows light to be reflected by the two opposite sidewalls in a lateral direction, wherein the two opposite sidewalls are spaced by a distance to cause the reflected light to produce a periodical intensity distribution in the photoresist layer in the lateral direction.

In some preferred embodiments, the above method further including a step of forming an anti-reflection coating on the target layer before the reflective structures are formed. The corresponding exposure system further includes an anti-reflection coating covering the target layer but underlying the two reflective structures.

Since the refractive index of a photoresist material is larger than that of air or water in which the lens is working and the exposure light is reflected by the sidewalls to form reflected light in a lateral direction that makes θ be 180°, a largest numerical aperture (=n·sin 90°=n, the refractive index of the photoresist material) can be achieved, and the patterns defined by the periodical intensity distribution caused by the reflected light can have the highest resolution (=λ/2n, a half of the light wavelength in the photoresist layer) at a given λ value.

It is to be understood that both of the foregoing general description and the following detailed description are exemplary, and are intended to provide further explanation of the invention as claimed.

DESCRIPTION OF THE PREFERRED EMBODIMENTS

This invention is further explained with the following embodiment illustrated by FIGS. 2A-2E, which is not intended to limit the scope of this invention.

Figure 1:
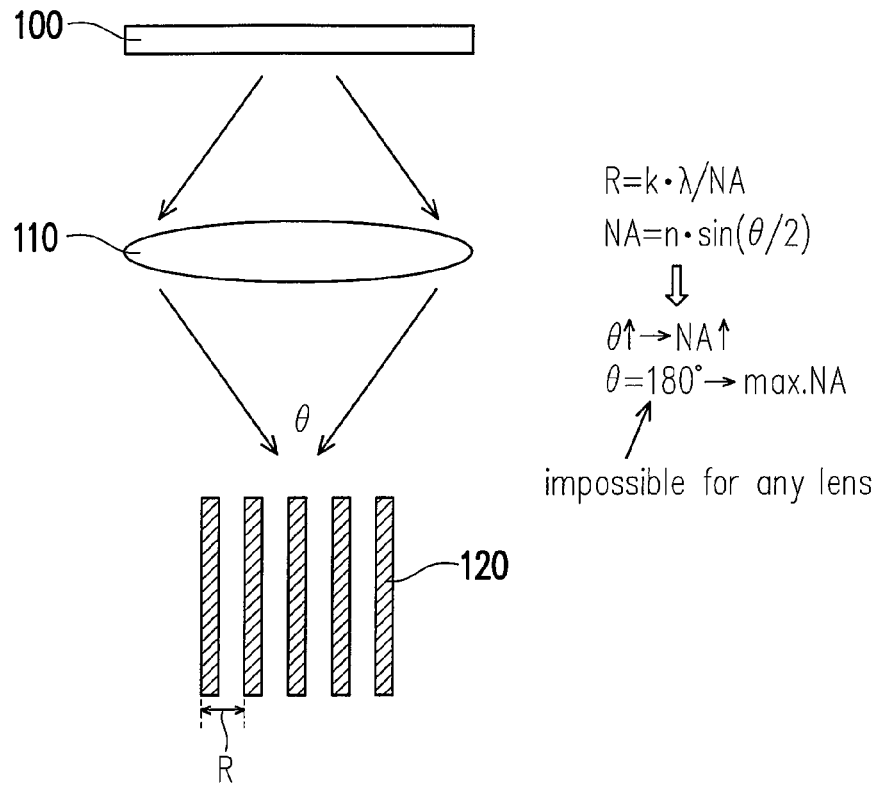
FIG. 1 illustrates a typical arrangement between a photomask, a lens set and the transferred patterns in a lithography process in the prior art.
Figure 2A:
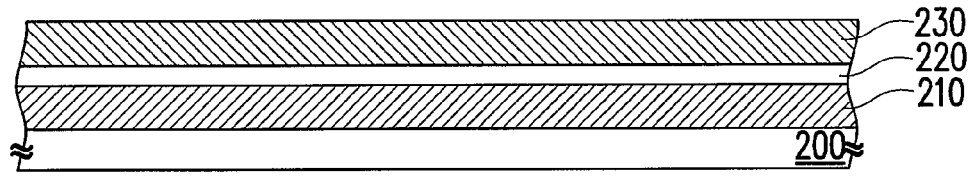
FIGS. 2A-2E illustrate a method of defining patterns in a small pitch according to an embodiment of this invention, wherein FIG. 2C also illustrates an exposure system according to the same embodiment.

Referring to FIG. 2A, a substrate 200 with a target layer 210 thereon is provided, and then a layer 230 of a reflective material is formed over the target layer 210. The target layer 210 may include a poly-Si layer, which is possibly formed as the precursor of a plurality of parallel gate lines. The reflective material may be a metal or any other material having a high reflectivity, wherein the metal may be Al, AlCu or Cu. The thickness of the layer 230 may range from 1000 to 3000 angstroms.

It is preferred that an anti-reflection coating 220 is further formed on the target layer 210 before the layer 230 is formed to absorb the light disturbing the periodical intensity distribution in the exposure step performed later. The material of the anti-reflection coating 220 may be an inorganic UV-absorbing material, and the thickness of the same may range from 200 to 1000 angstroms.

Figure 2B:
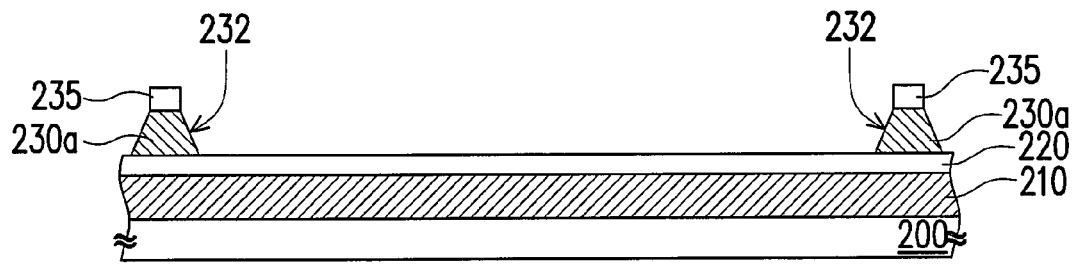

Referring to FIGS. 2A and 2B, two photoresist patterns 235 for defining two reflective structures are formed on the layer 230 of the reflective material with an ordinary lithography process, and then etching is conducted to pattern the layer 230 into two laterally separate reflective structures 230a that have two opposite sidewalls 232. By adjust the recipe of the etching or the photo process, each reflective structure 230a can have a trapezoid cross-section as shown in FIG. 2B or a triangular cross-section on which no photoresist remains. The height of the reflective structures 230a may range from 500 to 2000 angstroms.

Figure 2C:
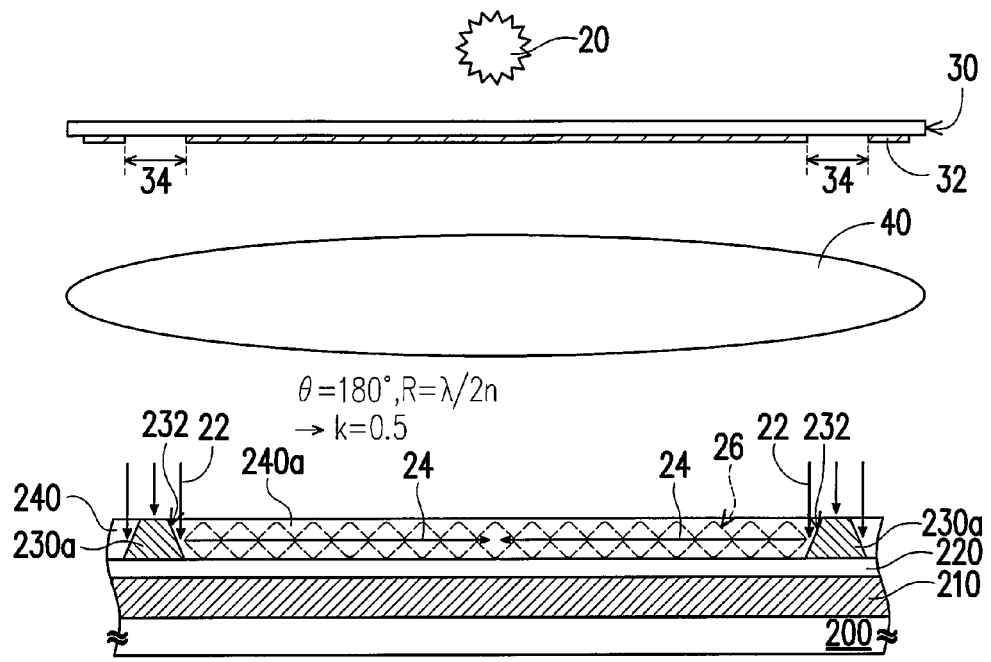

Referring to FIG. 2C that also illustrates an exposure system according to the same embodiment of this invention, after the photoresist patterns 235 are removed by photoresist stripping or by the etching defining the reflective structures 230a, another photoresist layer 240 is formed over the anti-reflection coating 220. The photoresist layer 240 includes a portion 240a between the two sidewalls 232.

An exposure step is then conducted with an exposure system that includes a light source 20 such as a laser of 193 nm, a photomask 30, a lens set 40, and the above two laterally separate reflective structures 230a having the two opposite sidewalls 232, wherein lens set 40 is represented by one lens for simplicity.

The photomask 30 includes an opaque layer 32 that has therein two openings 34, thereby masking the portion 240a of the photoresist layer 240 but allows the exposure light 22 passing the lens set 40 to be reflected by the two opposite sidewalls 232 to form reflected light 24 in a lateral direction. The photomask 30 is possibly a conventional photomask or a holographic one, preferably a holographic one because the exposure light passing a holographic photomask and the lens set 40 has a perpendicular incident angle to the photoresist layer 240a, which facilitates occurrence of a periodical intensity distribution. A holographic mask is similar to a chromeless mask, typically having multiple optical interference fringes thereon which are designed based on optical theory and are able to transfer an image with a special shape onto a photoresist layer.

Moreover, the two photoresist patterns 235 (FIG. 2B) are located such that the two opposite sidewalls 232 of the two reflective structures 230a are spaced by a distance allowing a periodical intensity distribution 26 to be caused in the portion 240a of the photoresist patterns 240. Specifically, the distance between the opposite sidewalls 232 has to be close to "$m \cdot \lambda / 2n$", wherein m is an integer, $\lambda$ is the wavelength of the exposure light and n is the reflective index of the photoresist layer 240.

The subsequent process includes a development step and an anisotropic etching step, each of which can be one already known in the prior art.

Figure 2D:
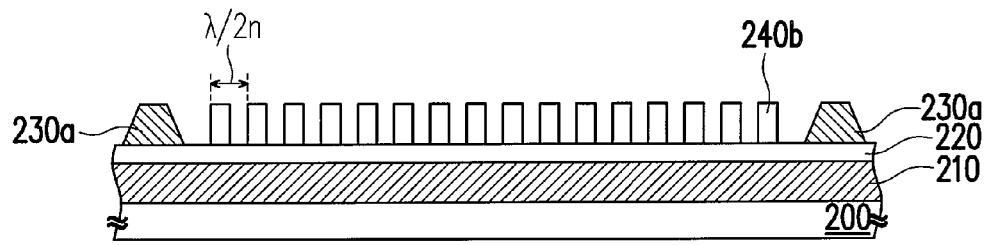

Referring to FIG. 2D, a plurality of photoresist patterns 240b are formed through the development step, wherein the position of each photoresist pattern 240b corresponds to that of one node of the periodical intensity distribution 26 at zero amplitude when the photoresist layer 240 is of positive type. The pitch between the photoresist patterns 240b, namely the resolution of the exposure step or system, is equal to "$\lambda/2n$". This corresponds to a conventional lithography process in which k is 0.5, according to the formulae of "$R=k\lambda/NA$" and "$NA=n \cdot \sin(180°/2)=n$".

Figure 2E:
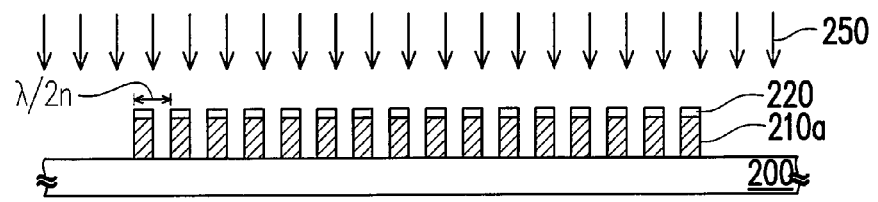

Referring to FIG. 2E, with the anisotropic etching step 250, the target layer 210 is patterned into a plurality of patterns 210a. The pitch between the patterns 210a is also equal to "$\lambda/2n$".

Since the refractive index of a photoresist material is larger than that of air or water in which the lens set is working and the exposure light is reflected by the two opposite sidewalls to form reflected light in a lateral direction that makes θ be 180°, a largest numerical aperture can be made, and the patterns defined by the periodical intensity distribution caused by the reflected light can have the highest resolution at a given wavelength of the exposure light.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method of defining patterns in a small pitch, comprising:
    providing a substrate having a target layer thereon;
    forming, over the target layer, two laterally separate reflective structures with two opposite sidewalls;
    forming, over the target layer, a photoresist layer between the two opposite sidewalls; and
    performing an exposure step that allows light to be reflected by the two opposite sidewalls in a lateral direction, wherein the two opposite sidewalls are spaced by a distance to cause the reflected light to produce a periodical intensity distribution in the photoresist layer in the lateral direction.

2. The method of claim 1, further comprising forming an anti-reflection coating on the target layer before the reflective structures are formed.

3. The method of claim 1, wherein the target layer comprises polysilicon.

4. The method of claim 1, wherein the two reflective structures comprise a metal.

5. The method of claim 4, wherein the metal is Al, AlCu or Cu.

6. The method of claim 1, wherein each of the two reflective structures has a trapezoid cross-section or a triangular cross-section.

7. The method of claim 1, wherein the photomask is a holographic photomask.

8. An exposure system capable of defining patterns in a small pitch, comprising:
    a light source;
    a lens set;
    a photomask between the light source and the lens set; and
    two laterally separate reflective structures having two opposite sidewalls, formed over a target layer on a substrate that has thereon a photoresist layer between the two opposite sidewalls,
    wherein the photomask allows light to be reflected by the two opposite sidewalls in a lateral direction, wherein the two opposite sidewalls are spaced by a distance to cause the reflected light to produce a periodical intensity distribution in the photoresist layer in the lateral direction.

9. The exposure system of claim 8, further comprising an anti-reflection coating covering the target layer but underlying the reflective structures.

10. The exposure system of claim 8, wherein the target layer comprises polysilicon.

11. The exposure system of claim 8, wherein the two reflective structures comprise a metal.

12. The exposure system of claim 11, wherein the metal is Al, AlCu or Cu.

13. The exposure system of claim 8, wherein each of the two reflective structures has a trapezoid cross-section or a triangular cross-section.

14. The exposure system of claim 8, wherein the photomask is a holographic photomask.

* * * * *